United States Patent
Nabatame et al.

(10) Patent No.: US 6,777,248 B1
(45) Date of Patent: Aug. 17, 2004

(54) DIELECTRIC ELEMENT AND MANUFACTURING METHOD THEREFOR

(75) Inventors: Toshihide Nabatame, Hitachi (JP); Takaaki Suzuki, Hitachinaka (JP); Kazutoshi Higashiyama, Naka-machi (JP); Tomoji Oishi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/554,116

(22) PCT Filed: Nov. 10, 1997

(86) PCT No.: PCT/JP97/04085

§ 371 (c)(1),
(2), (4) Date: May 10, 2000

(87) PCT Pub. No.: WO99/25014

PCT Pub. Date: May 20, 1999

(51) Int. Cl.[7] .................. H01L 21/00; H01L 21/8242; H01L 21/20
(52) U.S. Cl. .................. 438/3; 438/250; 438/253; 438/393; 438/396; 438/240
(58) Field of Search .................. 438/3, 240, 253, 438/250, 393, 396, 398

(56) References Cited

U.S. PATENT DOCUMENTS

| | | | | |
|---|---|---|---|---|
| 5,316,987 A | * | 5/1994 | Yasutomi et al. | 501/97 |
| 5,418,389 A | * | 5/1995 | Watanabe | 257/295 |
| 5,471,364 A | * | 11/1995 | Summerfelt et al. | 361/321.4 |
| 5,474,951 A | * | 12/1995 | Han et al. | 437/60 |
| 5,536,568 A | * | 7/1996 | Teruo | 428/327 |
| 5,548,475 A | * | 8/1996 | Ushikubo et al. | 361/321.4 |
| 5,624,741 A | * | 4/1997 | Scott | 428/210 |
| 5,757,061 A | * | 5/1998 | Satoh et al. | 252/532 |
| 5,970,337 A | * | 10/1999 | Nishioka | 438/240 |
| 5,973,911 A | * | 10/1999 | Nishioka | 361/313 |
| 5,998,819 A | * | 12/1999 | Yokoyama et al. | 257/295 |
| 6,069,820 A | * | 5/2000 | Inomata et al. | 365/171 |
| 6,143,597 A | * | 11/2000 | Matsuda et al. | 438/240 |
| 6,151,240 A | * | 11/2000 | Suzuki | 365/145 |
| 6,284,588 B1 | * | 9/2001 | Yu | 348/240 |
| 6,284,595 B1 | * | 9/2001 | Kato | 438/253 |
| 6,338,970 B1 | * | 1/2002 | Suh | 438/3 |

FOREIGN PATENT DOCUMENTS

JP  4-340281  * 11/1992

* cited by examiner

Primary Examiner—Wael Fahmy
Assistant Examiner—Shrinivas H. Rao
(74) Attorney, Agent, or Firm—Antonelli, Terry, Stout & Kraus, LLP

(57) ABSTRACT

A ferroelectric element having a high Pr and a low Ec and having a good withstand voltage, which is in the form of a thin film using a ferroelectric layer containing insulating particles, is provided. The ferroelectric layer containing the insulating particles is effective to suppress leakage current caused through grain boundaries of crystals, and hence to exhibit a high Pr and a low Ec and a good withstand voltage. The ferroelectric element has a structure in which such a ferroelectric layer in the form of a thin film is sandwiched between electrodes. By incorporating the ferroelectric element in a field effect transistor structure, it is possible to realize a highly integrated semiconductor device for detecting reading or writing.

7 Claims, 5 Drawing Sheets

50 Å

DIELECTRIC ELEMENT AND MANUFACTURING METHOD THEREFOR

TECHNICAL FIELD

The present invention relates to a ferroelectric element such as an FeRAM utilizing a non-volatile property of a ferroelectric material, a semiconductor device using the ferroelectric element, and a method of manufacturing the ferroelectric element. The present invention also relates to a high dielectric element such as a DRAM utilizing a high dielectric constant and a low leakage current density, a semiconductor device using the high dielectric element, and a method of manufacturing the high dielectric element.

BACKGROUND OF THE INVENTION

As a semiconductor memory, there is a DRAM (Dynamic Random Access Memory) having the ability of rewriting data at a high speed. DRAMs have been produced which have a large capacity of 16 M bits to 64 M bits in response to the progress of these technologies for realizing a higher density and a higher integration. Such large capacity also requires a technology for achieving finer geometries for circuit components, particularly, finer geometries for capacitors for storing information. For achieving finer geometries for capacitors, it is required to provide a thin dielectric film, to select a material having a high dielectric constant, and to change the structure of the capacitor composed of upper and lower electrodes and a dielectric material from two-dimensional to three-dimensional. With respect to a high dielectric material, it is known that BST (Ba/Sr)TiO$_3$ having a simple lattice perovskite crystal structure exhibits a dielectric constant ($\epsilon$) larger than that of SiO$_2$/Si$_3$N$_4$. An example of the use of such a high dielectric material has been reported in International Electron Device Meeting Technical Digest (IEDM Tech. Dig.), p. 823, 1991.

A non-volatile memory FeRAM (Ferroelectric Random Access Memory) using a ferroelectric material as a capacitor material has a characteristic capable of storing data in the OFF state of a power supply because it utilizes two residual polarization states which are different in polarity. The FeRAM has a feature in terms of rewriting data at a speed which is very high, such as the order of $\mu$s or less, and therefore, it is expected to provide an ideal memory in the next generation. In the case of such a FeRAM, it is also required to provide a thin ferroelectric film for achieving a large capacity. Incidentally, a semiconductor memory intended to suppress reactivity between a ferroelectric material and a metal electrode has been disclosed in Japanese Patent Application Laid-open No. 5-190797, in which PZT (lead zirconate titanate) is used as a ferroelectric material and a silicon nitride (SiNx) film operating as a diffusion preventive layer is formed around the ferroelectric material.

SUMMARY OF THE INVENTION

The above-described technologies, however, have failed to examine the suppression of the leakage current density accompanied by thinning of a dielectric material essentially to be performed for increasing the degree of integration. A memory using the above-described BST has the object of lowering an operational voltage along with higher integration. For lowering the operational voltage of a memory, it is required to ensure a sufficient capacitance at a small voltage. To increase such a capacitance, it has been proposed to select a material having a high dielectric constant, to increase the electrode area, and to make the high dielectric material thin. A thin film made of BST having a polycrystalline structure, however, has a problem in terms of withstand voltage characteristic because such a polycrystalline film allows leakage current to easily flow through grain boundaries of the crystals. For this reason, in the case of using the BST thin film as a capacitor, it is difficult to apply a sufficient operational voltage thereto.

In the above described ferroelectric capacitor, in which a silicon nitride film is formed around the PZT film, the silicon nitride film acts as a diffusion preventive layer capable of preventing thermal diffusion from elements of PZT, thereby maintaining a desirable stoichiometric composition of the ferroelectric material necessary for ferroelectric characteristics. The silicon nitride layer in the above-described ferroelectric capacitor, however, has a problem. Since the silicon nitride film has a dielectric constant as small as 7, it must be formed to an ultra-thin thickness of 30 Å or less for suppressing a lowering of the total capacitance of the ferroelectric capacitor having a size of 4 $\mu$m$^2$. Further, in the case of a higher integration in the order of 1 G bits, the area of the capacitor becomes as small as 0.1 $\mu$m$^2$. In this case, it becomes apparent on the basis of simple calculation that the silicon nitride layer must be formed to a further ultra-thin thickness of 1 Å or less.

Additionally, in the thinning process used in the prior technologies, if a metal is as an electrode, there occurs a problem that a transition layer is formed by diffusion of an element at an interface between a dielectric thin film and the metal electrode, to thereby reduce spontaneous polarization (Pr), to increase field reversing (Ec), and to give rise to film fatigue.

To solve the above-described problems, the present invention has been made, and an object of the present invention is to provide a high dielectric layer containing insulating particles, which is capable of suppressing leakage current flow through grain boundaries of crystals and which can be thinned to such an extent as to meet a requirement of high integration; a high dielectric element in which the high dielectric thin film is sandwiched between upper and lower electrodes; a semiconductor device using the high dielectric element; and a method of manufacturing the high dielectric element.

Another object of the present invention is to solve the above-described problems and to provide a ferroelectric layer containing insulating particles, which is capable of suppressing leakage current flow through grain boundaries of crystals and which can be thinned to such an extent as to meet a requirement of high integration; a ferroelectric element in which the ferroelectric thin film is sandwiched between upper and lower electrodes; a semiconductor device using the ferroelectric element; and a method of manufacturing the ferroelectric element.

A further object of the present invention is to provide a high dielectric element or a ferroelectric element including the above mentioned high dielectric thin film or the above mentioned ferroelectric thin film having a thickness of 200 Å or more, wherein the element can be supplied with an operation voltage of 2 V for operating a semiconductor memory.

A further object of the present invention is to provide a high dielectric element in which a conductive oxide is used as an electrode which is in contact with the above mentioned high dielectric thin film to suppress formation of a transition layer, and a method of manufacturing the high dielectric element.

A further object of the present invention is to provide a ferroelectric element in which a conductive oxide is used as an electrode which is in contact with the above mentioned ferroelectric thin film to suppress formation of a transition layer, and a method of manufacturing the ferroelectric element.

To achieve the above objects, according to the present invention, there is provided a ferroelectric element including an upper electrode, a ferroelectric thin film, and a lower electrode, wherein the ferroelectric layer contains insulating particles having a resistance of $10^6$ $\Omega$ or more.

According to the present invention, there is provided a high dielectric element including an upper electrode, a high dielectric thin film, and a lower electrode, wherein the high dielectric layer contains insulating particles having a resistance of $10^6$ $\Omega$ or more.

The insulating particles have particle sizes each being in a range of 50 Å or less.

The ferroelectric thin film may be made of a material selected from the group consisting of a material expressed by $(Pb_{1-x}A_x)(Zr_{1-y}Ti_y)O_3$ (where A is one element selected from the group consisting of La, Ba, and Nb), and a material expressed by $(AO)^{2+}(B_{y-1}C_yO_{3y+1})^{2-}$ (where A is at least one element selected from the group consisting of Tl, Hg, Pb, Bi, and a rare earth element; B is at least one element selected from the group consisting of Bi, Pb, Ca, Sr, and Ba; and C is at least one element selected from the group consisting of Ti, Nb, Ta, W, Mo, Fe, Co, Cr and Zr; and y=2, 3, 4, and 5).

The high dielectric thin film may be made of one material selected from the group consisting of a material expressed by $(Ba_{1-x}Sr_x)TiO_3$ and a material expressed by $(Pb_{1-x}A_x)(Zr_{1-y}Ti_y)O_3$ (where A is one element selected from the group consisting of La, Ba and Nb).

The insulating particles may be those of a compound containing Si.

The lower electrode may be composed of a metal, a conductive oxide of a single element, and a conductive oxide having a perovskite structure, which are formed on a base substrate in this order, and each of the conductive oxides may be oriented along a specific plane.

The upper electrode may be composed of a conductive oxide having a perovskite structure and a metal or it may comprise a conductive oxide having a perovskite structure, a conductive oxide of a single element, and a metal, which are formed in this order from the side in contact with the ferroelectric thin film or the high dielectric thin film.

In the case where the ferroelectric thin film has a thickness of 200 Å or more, the ferroelectric element may exhibit a withstand voltage of 2 V or more at a leakage current density of $10^{-5}$ A/cm$^2$ or less.

In the case where the high dielectric thin film has a thickness of 200 Å or more, the high dielectric element may exhibit a withstand voltage of 2 V or more at a leakage current density of $10^{-5}$ A/cm$^2$ or less.

The metal used for the electrode may be at least one metal selected from the group consisting of Pt, Au, Al, Ni, Cr, Ti, Mo, and W. Also, to realize the function of the electrode material, a conductive oxide of a single element or a perovskite structure, which has a resistivity of 1 m$\Omega$·cm or less, may be used as the electrode. The conductive oxide of a single element may be an oxide of at least one element selected from the group consisting of Ti, V, Eu, Cr, Mo, W, Rh, Os, Ir, Pt, Re, Ru and Sn. The conductive oxide having a perovskite structure may be at least one kind of perovskite oxide selected from the group consisting of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$, and $BaPbO_3$, and has a resistivity of 1 m$\Omega$·cm or less.

According to the present invention, there is provided a method of forming the ferroelectric thin film, including the step of forming the ferroelectric thin film by sputtering in an atmosphere of a mixed gas of oxygen and an inert gas at a temperature of 650° C. or less. In addition, the film formation temperature is selected to suppress reaction with an electrode. Instead of the sputtering method described above, the ferroelectric thin film may be formed by MOCVD in an atmosphere of oxygen or excited oxygen at a temperature of 650° C. or less.

According to the present invention, there is provided a method of forming a ferroelectric thin film, including the step of forming the ferroelectric thin film by applying a starting material composed of a metal alkoxide or a metal salt of an organic acid on a substrate by spin-coating or dip-coating and baking the film at a normal pressure and at a temperature of 650° C. or less. In addition, the film formation temperature is selected to suppress a reaction with the electrode.

According to the present invention, there is provided a method of forming a high dielectric thin film, including the step of forming the high dielectric thin film by sputtering in an atmosphere of a mixed gas of oxygen and an inert gas at a temperature of 650° C. or less. In addition, the film formation temperature is selected to suppress reaction with the electrode. Instead of the sputtering method described above, the high dielectric thin film may be formed by MOCVD in an atmosphere of oxygen or excited oxygen at a temperature of 650° C. or less.

According to the present invention, there is provided a method of forming a high dielectric thin film, including the step of forming the high dielectric thin film by applying a starting material composed of a metal alkoxide or a metal salt of an organic acid on a substrate by spin-coating or dip-coating and baking the film at a normal pressure and at a temperature of 650° C. or less. In addition, the film formation temperature is selected to suppress a reaction with the electrode. According to the present invention, there is provided a method of forming the conductive oxide of a single element or a perovskite structure, including the step of forming a conductive oxide of a single element or a perovskite structure by sputtering in an atmosphere of a mixed gas of oxygen and an inert gas at a temperature of 650° C. or less. Instead of the sputtering method described above, the conductive oxide of a single element or the perovskite structure may be formed by MOCVD in an atmosphere of oxygen or excited oxygen at a temperature of 650° C. or less.

According to the present invention, there is provided a method of forming the conductive oxide of a single element or the provskite structure, including the step of forming the conductive oxide of a single element or the provskite structure by applying a starting material composed of a metal alkoxide or a metal salt of an organic acid on a substrate by spin-coating or dip-coating and baking the film at a normal pressure and at a temperature of 650° C. or less. In addition, the film formation temperature is selected to suppress a reaction with an electrode.

Further, in the step of forming the ferroelectric thin film from a stating material composed of a metal alkoxide or a metal salt of an organic acid by spin-coating or dip-coating, the ferroelectric thin film may be formed while irradiating ultraviolet rays to the ferroelectric thin film. This is based on the knowledge that the decomposition of a raw material caused by light irradiation is considered effective for lowering the film formation temperature. The high dielectric thin film may be also formed while irradiating ultraviolet rays to the high dielectric thin film in the same manner as described above, and further, the conductive oxide may be formed while irradiating ultraviolet rays to the high dielectric thin film in the same manner as described above.

According to the present invention, there is provided a semiconductor device, wherein the structure including the upper electrode, the ferroelectric thin film, and the lower electrode is formed as a capacitor in a structure of a field effect transistor.

Further, according to the present invention, there is provided a semiconductor device, wherein the structure including the upper electrode, the high dielectric thin film, and the lower electrode is formed as a capacitor in a structure of a field effect transistor.

BEST MODE FOR CARRYING OUT THE INVENTION

Figure 1:
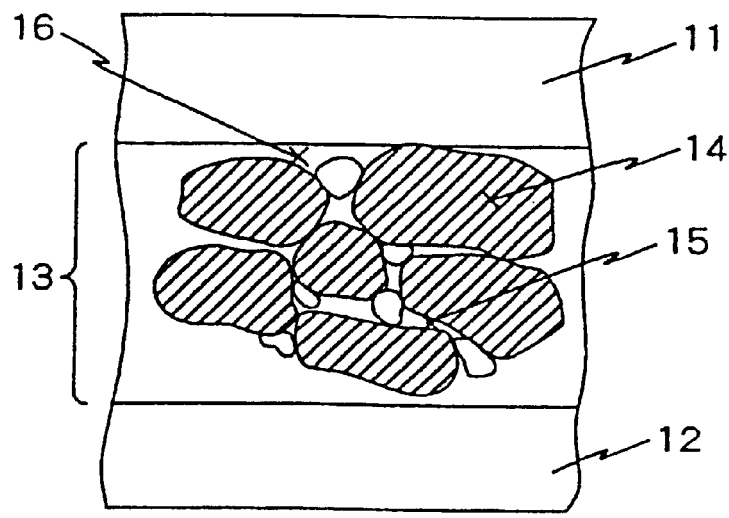
FIG. 1 is a diagram of a ferroelectric layer of the present invention.

Hereinafter, embodiments of the present invention will be described with reference to the drawings. The present invention, however, is not limited thereto.

In addition, reference numerals in the drawings are as follows:

Each of reference numerals 31, 41, 81, 91 indicates an upper electrode; each of the reference numerals 32, 71, 81, and 92 denotes a ferroelectric thin film; reference numeral 42 denotes a high dielectric thin film; each of the reference numerals 33, 43, 83, and 93 denotes a lower electrode; each of the reference numerals 34, 44, and 75 denotes a base substrate; each of the reference numerals 72 and 82 denotes a conductive oxide having a perovskite structure; each of the reference numerals 73 and 83 denotes a conductive oxide of a single element; each of the reference numerals 74 and 84 denotes a metal; each of the reference numerals 94 and 96 denotes a $SiO_2$ film; reference numeral 95 denotes Si; numeral 97 denotes a diffusion layer; numeral 98 denotes a gate electrode; and numeral 99 denotes a $SiO_2$ gate film.

Embodiment 1

Figure 2:
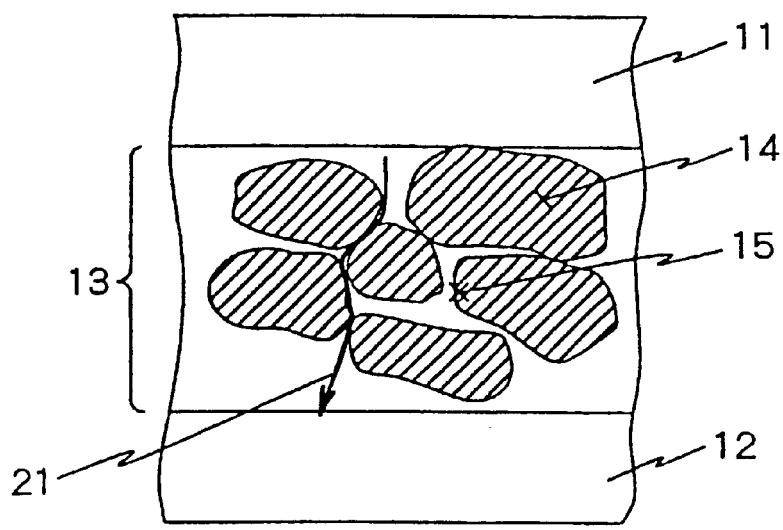
FIG. 2 is a diagram of a prior art ferroelectric layer.

FIG. 1 is a view showing a structure including an upper electrode 11, a ferroelectric layer 13, and a lower electrode 12 according to the present invention. In the ferroelectric layer 13, insulating particles 16 containing Si are precipitated at crystal grain boundaries 15 between crystals 14 of a ferroelectric material. Such a structure makes it possible to suppress reduction in withstand voltage characteristic which is, as shown by a comparative example in FIG. 2, due to a leakage current 21 flowing through grain boundaries of crystals of a ferroelectric material, and, hence, it is possible to apply an operational voltage essential for operation of a memory. Further, since particle sizes of the insulating particles are each in a range of 50 Å or less, the insulating particles exert only a small effect on the capacitance of a capacitor even if the insulating particles have a dielectric constant smaller than that of the dielectric material. As a result, a capacitor having such a structure can provide a capacitance of more than 30 fF necessary for a DRAM.

Figure 3:
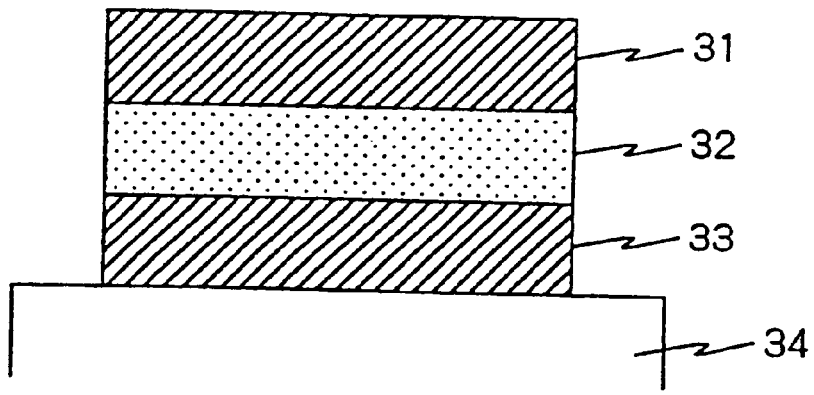
FIG. 3 is a sectional view showing a ferroelectric element of the present invention.

Next, there will be described a method of preparing a ferroelectric thin film made from a material expressed by a chemical structural formula of $(AO)^{2+}(B_1C_2O_7)^{2-}$ where A=Bi, B=Sr, and C=Ta. In a sectional view of a ferroelectric element as shown in FIG. 3, reference numeral 34 indicates a base substrate. First, as the base substrate 34, there was used a Si wafer on which a TiN layer as a barrier layer was formed to a thickness of 200 Å at a temperature of 300° C. and a $SiO_2$ layer was formed thereon by thermal oxidation. Then, a base electrode 33 was formed on the base substrate 34. As the backing electrode, a Pt thin film was formed to a thickness of 1,000 Å by sputtering at a temperature of 350° C. A ferroelectric thin film 32 was then formed on the lower electrode 33 as follows. First, a solution of alkoxides of Bi, Sr, Ta, and Si was applied on the lower electrode 33 by spin-coating at 1,500 rpm for 30 sec, the electrode was dried at 150° C. for 5 min, and then it was subjected to pre-heat treatment in air or oxygen at a temperature of 200 to 550° C. lower than a crystallization temperature of the ferroelectric thin film, that is, 580° C. for 10 to 30 min. Such a procedure was taken as one cycle, and the cycle was repeated 2–5 times, to form a precursor thin film having a thickness of 1,000 Å. The precursor thin film was finally heat-treated at a temperature of 580 to 650° C., to obtain a ferroelectric layer of $(Bi_2O_2)^{2+}(SrTa_2O_7)^{2-}$ containing an amorphous Si compound.

Figure 5:
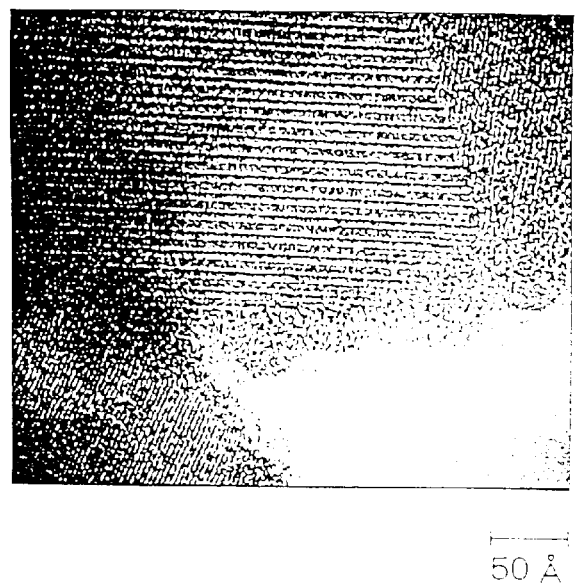
FIG. 5 is a photograph by a TEM, showing the ferroelectric layer of the present invention.

The ferroelectric layer thus obtained was observed by a TEM, which gave a result as shown in FIG. 5. As is apparent from FIG. 5, amorphous particles having particle sizes each in a range of 20 to 50 Å were recognized between crystals of the ferroelectric material having particle sizes each in a range of 100 to 1,000 Å. The amorphous particles were those of a compound containing Si, Bi, Sr and Ta. The composition of the compound was largely dependent on the state of the particles.

Figure 6:
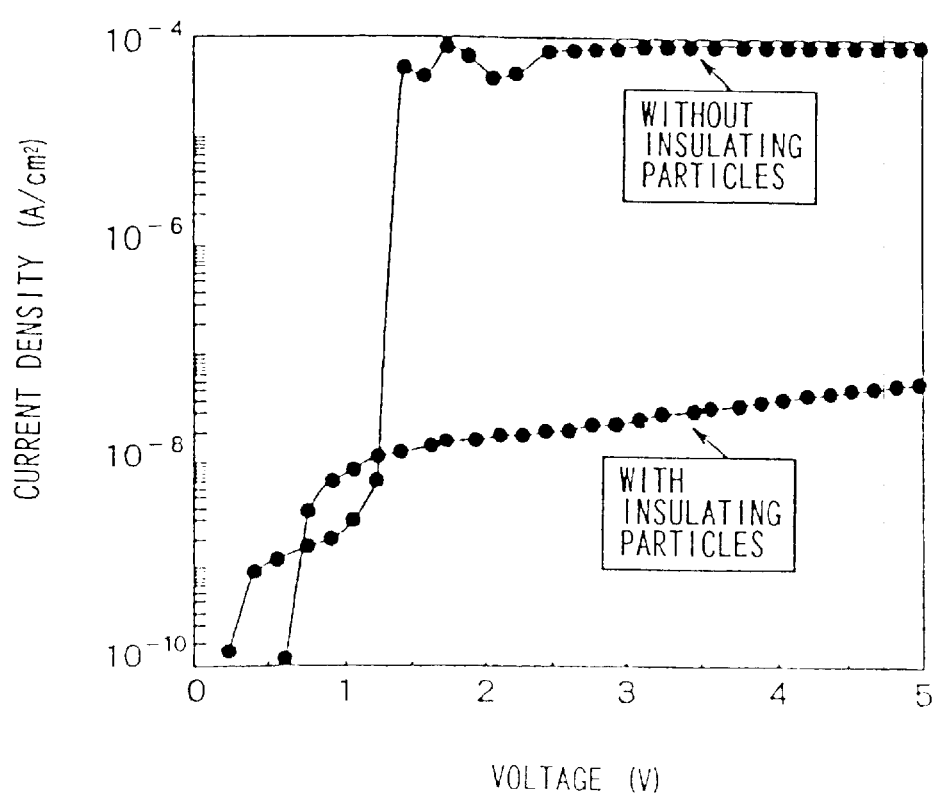
FIG. 6 is a graph showing data on a leakage current density of the ferroelectric element of the present invention.

A result of examining a relationship between a voltage and a leakage current density for such a ferroelectric element is shown in FIG. 6. For a ferroelectric element containing no particles, a leakage current density was as large as $10^{-4}$ $A/cm^2$ at 1 V. As a result, a ferroelectric element could not used as a capacitor. On the contrary, for the ferroelectric element containing particles, the leakage current density was very small, such as $1 \times 10^{-7}$ $A/cm^2$ or less at 5 V. This shows that the ferroelectric element containing particles exhibits a very good withstand voltage characteristic. The ferroelectric element containing particles also exhibited good ferroelectric characteristics. That is, 2Pr was 16 $\mu C/cm^2$ at 3 V, Ec was 40 kV/cm, and degradation of the characteristics was about 3% after writing $10^{15}$ times by positive/negative reversal of a voltage of 3 V. Consequently, in the ferroelectric element containing particles, reduction in characteristics due to precipitation of particles was not recognized.

Figure 10:
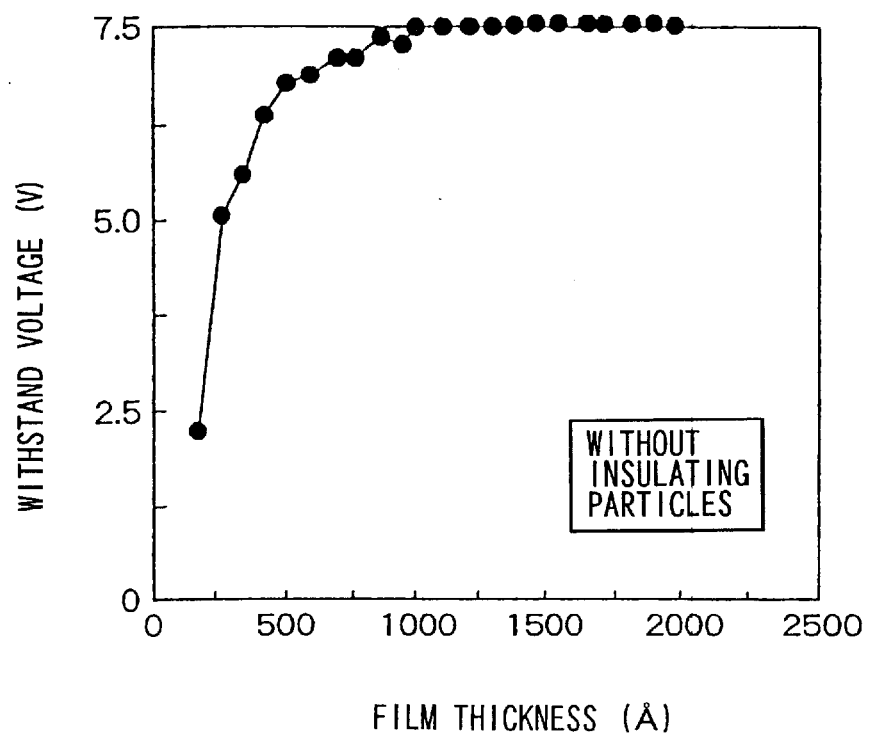
FIG. 10 is a graph showing a relationship between film thickness and the withstand voltage characteristic for the ferroelectric element of the present invention.

A relationship between a film thickness and a withstand voltage characteristic for the ferroelectric layer of $(Bi_2O_2)^{2+}(SrTa_2O_7)^{2-}$ containing the above insulating particles is shown in FIG. 10. Samples each having a film thickness of 200 to 2,000 Å were prepared by changing the above-described cycle of the procedure for forming a precursor thin film. As is apparent from FIG. 10, the withstand voltage was 2 V or more at the leakage current density of $10^{-5}$ A/cm² for the samples each having a film thickness of 200 Å or more.

Although in the above embodiment $(Bi_2O_2)^{2+}(SrTa_2O_7)^{2-}$ is used as the ferroelectric material, a solution of an alkoxide of Si may be added to a ferroelectric material having a perovskite crystal structure expressed by a chemical structural formula of $(AO)^{2+}(B_{y-1}C_yO_{3y+1})^{2-}$ where the A site is at least one element selected from the group consisting of Tl, Hg, Y, Ce, Pr, Nd, Pm, Eu, Gd, Tb, Dy, Ho, Er, Tm, Yb, and Lu; the B site is at least one element or more selected from the group consisting of Bi, Pb, Ca, Sr, and Ba; the C site is at least one element or more selected from the group consisting of Ti, Nbi Ta, W, Mo, Fe, Co, Cr, and Zr; and y=2, 3, 4, and 5.

Further, another ferroelectric thin film 32 was formed on the lower electrode 33 obtained in the same manner as described above. First, a solution of alkoxides of Pb, Zr, Ti, and Si was applied on the lower electrode 33 by spin-coating at 1,500 rpm for 30 sec, the electrode was dried at 150° C. for 5 min, and then it was subjected to pre-heat treatment in air or oxygen at a temperature of 200 to 400° C. lower than a crystallization temperature of the ferroelectric thin film, that is, 450° C. for 10 to 30 min. Such a procedure was taken as one cycle, and the cycle was repeated 2–5 times, to form a precursor thin film having a thickness of 1,000 Å. The precursor thin film was finally heat-treated at a temperature of 500 to 650° C., to obtain a ferroelectric layer of $Pb(Zr_{0.5}Ti_{0.5})O_3$ containing an amorphous Si compound. For, this ferroelectric element containing particles, the leakage current density was very small, such as $1×10^{-7}$ A/cm² or less at 5 V. This shows that the ferroelectric element exhibits a very good withstand voltage characteristic. The ferroelectric element also exhibited good ferroelectric characteristics. For example, 2Pr was 40 µC/cm² at 3 V, Ec was 60 kV/cm, and degradation of characteristics was about 3% after writing 1012 times by ± reversal of a voltage of 3 V. Consequently, reduction in characteristics due to precipitation of particles was not recognized. Further, with respect to the dependency of the film thickness on the withstand voltage, the withstands voltage was 2 V or more at the leakage current density of $10^{-5}$ A/cm² for the samples each having a thickness of 200 Å or more.

Although in the above embodiment $Pb(Zr_{0.5}Ti_{0.5})O_3$ is used as the ferroelectric material, a solution of an alkoxide of Si may be added to a ferroelectric material having a perovskite crystal structure expressed by a chemical structural formula of $(Pb_{1-x}A_x)(Zr_{1-y}Ti_y)O_3$ where the A site is substituted for at least one element or more selected from a group consisting of La, Ba, and Nb; and each of x and y is in a range of 0 to 1.

Embodiment 2

Figure 4:
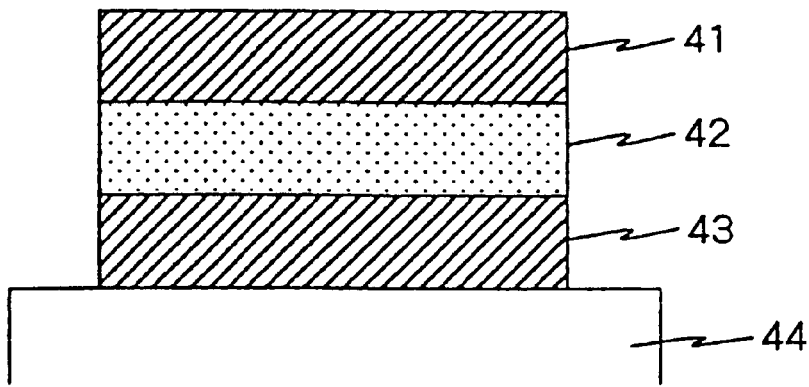
FIG. 4 is a sectional view showing a high dielectric element of the present invention.

Next, there will be described a method of preparing a high dielectric layer having a crystal structure expressed by $(Ba_{0.5}Sr_{0.5})TiO_3$ in this embodiment. In a sectional view of a high dielectric element as shown in FIG. 4, reference numeral 44 indicates a base substrate. As the base substrate, there was used a Si wafer on which a TiN layer as a barrier layer was formed to a thickness of 200 Å at a temperature of 300° C. and a SiO₂ layer was then formed by thermal oxidation. Then, a lower electrode 43 was formed on the base substrate 44. As the lower electrode, a Pt thin film having a thickness of 1,000 Å was formed by sputtering at a temperature of 350° C. A high dielectric thin film 42 was formed on the lower electrode 43 as follows. First, a solution of alkoxides of Ba, Sr, Ti, and Si was applied on the lower electrode 43 by spin-coating at 1,500 rpm for 30 sec, the electrode was dried at 150° C. for 5 min, and then it was subjected to pre-heat treatment in air or oxygen at a temperature of 200 to 550° C. lower than a crystallization temperature of the ferroelectric thin film, that is, 580° C. for 10 to 30 min. Such a procedure was taken as one cycle, and the cycle was repeated 2–5 times, to form a precursor thin film having a thickness of 1,000 Å. The precursor thin film was finally heat-treated at a temperature of 580 to 650° C., to thus obtain a high dielectric layer of $(Ba_{0.5}Sr_{0.5})TiO_3$ containing an amorphous Si compound. The high dielectric layer thus obtained was observed by a TEM, which gave a result in which amorphous particles having particle sizes each in a range of 20 to 50 Å were recognized between crystals of the high dielectric material having particle sizes each in a range of 100 to 500 Å. The particles were those of a compound containing Si, Ba, Sr and Ti, and the composition of the compound was largely dependent on the state of the particles. As a result of examining a relationship between the voltage and leakage current density for the high dielectric element, it was found that the leakage current density was very small, such as $1×10^{-7}$ A/cm² or less at 3 V. This shows that the ferroelectric element containing particles exhibits a very good withstand voltage characteristic. The ferroelectric element also exhibited a dielectric constant (ϵ) of 250 at a frequency of 1 MHz which was larger than that of $SiN_x$, and consequently, it was found that degradation of characteristics due to precipitation of particles was not recognized. With respect to the dependency of the film thickness on the withstand voltage, the withstand voltage was 2 V or more at the leakage current density of $10^{-5}$ A/cm2 for the high dielectric thin film having a thickness of 200 Å or more.

Although in the above embodiment $(Ba_{0.5}Sr_{0.5})TiO_3$ is used as the ferroelectric material, a solution of an alkoxide of Si may be added to a high dielectric material having a perovskite crystal structure expressed by a chemical formula of $(Ba_{1-x}Sr_x)TiO_3$ where x is adjusted in a range of 0 to 1.

Embodiment 3

Figure 7:
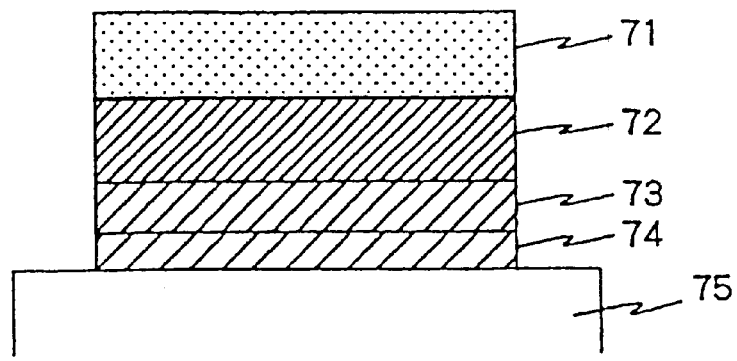
FIG. 7 is a sectional view showing an internal configuration of a lower electrode of the present invention.

FIG. 7 is a view showing an internal configuration of a lower electrode in this embodiment. The lower electrode includes a metal 74, a conductive oxide 73 of a single element, and a conductive oxide 72 having a perovskite structure. Although in each of the embodiments 1 and 2, a metal electrode was used as the lower electrode, a lower electrode in contact with a ferroelectric material is made from a conductive oxide having a perovskite structure in this embodiment. Such a lower electrode was effective to suppress an oxygen loss layer having been generally recognized at an interface between a ferroelectric material and a metal electrode, and hence to suppress lowering of Pr due to reversal of voltage. In formation of this lower electrode, the metal, conductive oxide of a single element, and conductive oxide having a perovskite structure were laminated in this order on a base substrate. This was effective to improve the adhesiveness between adjacent ones of the layers. This was also effective to control orientation of the conductive oxide having a perovskite structure and hence to form a ferroelectric thin film or a high dielectric thin film on the conductive oxide while controlling the orientation of the thin film. Hereinafter, there will be described a method of preparing the lower electrode. First, the metal 74 represented by Ru was formed on the above-described base substrate 34 to a thickness of 1,000 Å by sputtering at a temperature of 600° C.; the conductive oxide 73 of a single element represented by RuO was formed thereon to a thickness of 1,000 Å by sputtering in an oxygen atmosphere at a temperature of 450° C.; and the conductive oxide 72 having a perovskite structure represented by $SrRuO_3$ was formed thereon to a thickness of 1,000 Å by sputtering at a temperature of 650° C. On the lower electrode 33, there was formed a ferroelectric layer of $(Bi_2O_2)^{2+}(SrTa_2O_7)^{2-}$ containing an amorphous Si compound in the same manner as in the first embodiment. The orientation of the ferroelectric thin film was examined by X-ray diffraction, which gave the result in which the C-axis was tilted 45°. Further, the pole figure measurement using a diffraction peak of the (105) face showed that the degree of orientation was 93%.

Figure 8A:
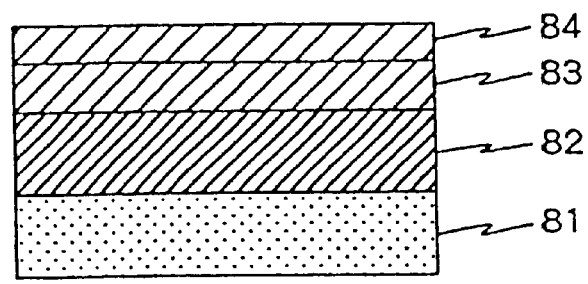
FIGS. 8(a) and 8(b) are sectional views showing an internal configuration of a lower electrode of the present invention.

Next, a configuration of an upper electrode in this embodiment is shown in FIG. 8(a). An upper electrode 31 includes a conductive oxide 82 having a perovskite structure, a conductive oxide 83 of a single element, and a metal 84. Like the case of using the conductive oxide as the lower electrode, the above upper electrode 31 was effective to suppress an oxygen loss layer having been generally recognized at an interface between a ferroelectric material and a metal electrode. A conductive oxide having a perovskite structure, represented by $SrRuO_3$, was formed on the above ferroelectric layer of $(Bi_2O_2)^{2+}(SrTa_2O_7)^{2-}$ containing an amorphous Si compound to a thickness of 1,000 Å by sputtering in an oxygen atmosphere at a temperature of 650° C. Further, the conductive oxide 83 of a single element, represented by RuO, was formed thereon to a thickness of 1,000 Å by sputtering in an oxygen atmosphere at a temperature of 450° C., and then the metal 84 represented by Ru was formed thereon to a thickness of 1,000 Å by sputtering at a temperature of 600° C. The ferroelectric element exhibited good ferroelectric characteristics. For example, the leakage current density was $1 \times 10^{-8}$ A/cm$^2$ at 5 V; 2Pr was 16 μC/cm$^2$ at 3 V and Ec was 40 kV/cm; and degradation of characteristic was about 5% after rewriting $10^{15}$ times by positive/negative reversal of a voltage of 3 V.

Although in this embodiment $(Bi_2O_2)^{2+}(SrTa_2O_7)^{2-}$ was used as the ferroelectric material, it is also possible to use the ferroelectric material expressed by the chemical structural formula of $(AO)^{2+}(B_{y-1}C_yO_{3y+1})^{2-}$ or the ferroelectric material expressed by the chemical structural formula of $(Pb_{1-x}A_x)(Zr_{1-y}Ti_y)O_3$ in the first embodiment, or the high dielectric material expressed by the chemical structural formula of $(Ba_{1-x}Sr_x)TiO_3$ in the second embodiment.

With respect to the above upper and lower electrodes, specific examples of the metal may include Pt, Au, Al, Ni, Cr, Ti, Mo, and W; specific examples of the conductive oxide of a single element may include $TiO_x$, $VO_x$, EuO, $CrO_2$, $MoO_2$, $WO_2$, RhO, OsO, IrO, PtO, $ReO_2$, $RuO_2$, and $SnO_2$; and specific examples of the conductive oxide having a peropvskite structure may include $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$, and $BaPbO_3$.

Figure 8B:
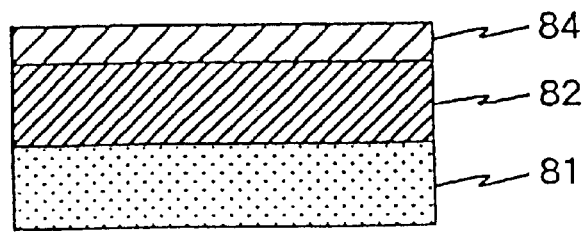

Further, after formation of the lower electrode, and a ferroelectric thin film or a high dielectric thin film in the same manner as described above, another upper electrode of the present invention shown in FIG. 8(b) was formed, as follows. Like the above embodiment, a conductive oxide 82 having a perovskite structure, represented by either of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$, and $BaPbO_3$ was formed to a thickness of 1,000 Å by sputtering in an oxygen atmosphere at a temperature of 650° C., and then a metal 84, represented by either of Pt, Au, Al, Ni, Cr, Ti, Mo, and W was formed to a thickness of 1,000 Å by sputtering at a temperature of 600° C., to form an upper electrode, thereby preparing a ferroelectric element or a high dielectric element.

Embodiment 4

Although a metal alkoxide is used as a starting material for spin-coating for forming a high dielectric thin film in each of Embodiments 1 to 3, a ferroelectric thin film or a high dielectric thin film can be prepared by spin-coating using as a starting material a metal acetyleacetonato, a metal carbonate, an acetate, or a metal soap such as a metal naphthenate or metal octylate.

Similarly, a ferroelectric thin film or a high dielectric thin film can be prepared in the same process as described above by dip-coating using as starting material a metal alkoxide, a metal acetyleacetonato, a metal carbonate, an acetate, or a metal soap such as a metal naphthenate or metal octylate.

In preparation of a ferroelectric thin film or a high dielectric thin film in each of Embodiments 1 to 3, a ferroelectric thin film or a high dielectric thin film having a thickness of 1,000 Å was obtained by sputtering in an atmosphere containing oxygen gas at a pressure of 0.02 to $10^{-4}$ torr at a temperature of 530 to 650° C. for 1 hr.

Also, in preparation of a ferroelectric thin film or a high dielectric thin film in each of Embodiments 1 to 3, a ferroelectric thin film or a high dielectric thin film having a thickness of 1,000 Å was obtained by laser vapor-deposition using a sintered body having the same composition as that of the above high dielectric thin film in an atmosphere containing oxygen gas at a pressure of 0.3 to $10^{-4}$ torr at a temperature of 530 to 650° C. for 1 hr.

Further, in preparation of a ferroelectric thin film or a high dielectric thin film in each of Embodiments 1 to 3, a ferroelectric thin film or a high dielectric thin film having a thickness of 1,000 Å was obtained by MOCVD using β-diketone complex compound, or phenyl-group or o-tolyl group compound as a starting material in an atmosphere containing oxygen gas at a pressure of 0.3 to $10^{-4}$ torr at a temperature of 530 to 650° C. for 2 hr.

In the above laser vapor-deposition or MOOCVD process, a ferroelectric thin film or a high dielectric film having a thickness of 1,000 Å was obtained in an atmosphere containing excited oxygen (ozone, ECR or microwave plasma) at a pressure of 0.3 to $10^{-4}$ torr at a temperature of 500 to 620° C. for 1–2 hr.

Further, in preparation of either of a metal, a conductive oxide of a single element, a conductive oxide of a perovskite structure in each embodiment, by carrying out the same process as described above, it is possible to use a metal, a conductive oxide of a single element, a conductive oxide of a perovskite structure like the above examples in this embodiment.

Embodiment 5

Figure 9:
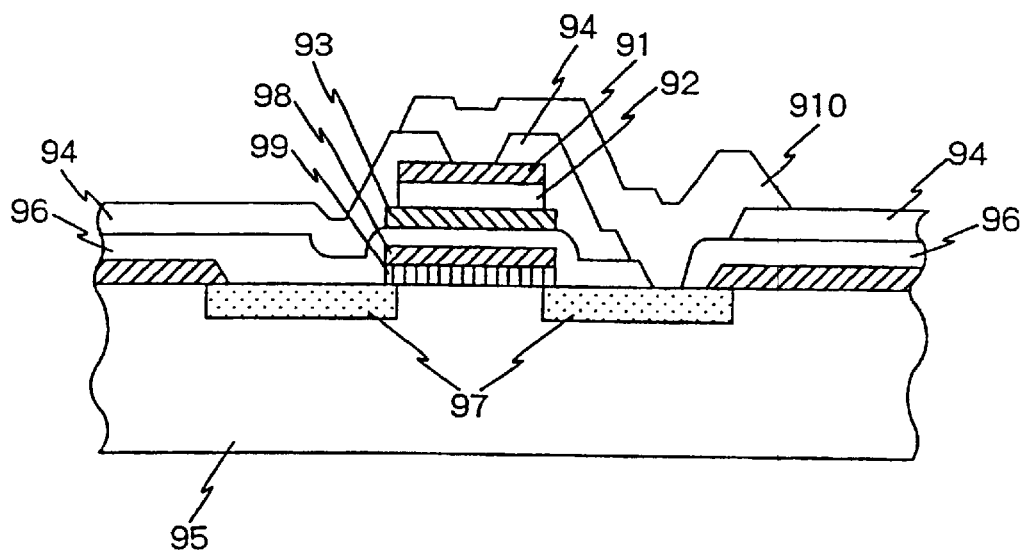
FIG. 9 is a sectional view showing a semiconductor device using the ferroelectric element of the present invention.

FIG. 9 is a view showing a semiconductor device including a ferroelectric element. The semiconductor device is prepared in the following manner. First, a diffusion layer 97 is formed on an Si wafer 95 by ion implantation and heat-treatment; an $SiO_2$ gate film 99 is formed thereon by surface oxidation; and a gate electrode 98 is formed thereon. After formation of an $SiO_2$ film 94 and an $SiO_2$ film 96 for element isolation between a transistor and a capacitor, an aluminum interconnection 910 is formed to connect an upper electrode 91 to the diffusion layer 97. As a ferroelectric element, a structure including the upper electrode 91, a ferroelectric thin film 92 and a lower electrode 93, which was prepared in Embodiments 1 to 4, was formed to obtain a semiconductor device including the ferroelectric element. The semiconductor device including the ferroelectric element thus obtained enables detection by a change in stored charge capacitance obtained at a voltage of 3 V.

Although this embodiment has a structure including the upper electrode 91, ferroelectric thin film 92, and lower electrode 93, there may be formed a high dielectric element having a structure including an upper electrode, a high dielectric thin film, and a lower electrode. The semiconductor device including the high dielectric element thus obtained has a storage charge capacitance of 30 fF at a voltage of 3 V.

As described above, according to the present invention, there can be provided a highly integrated ferroelectric element having a high Pr and a low Ec and having a good withstand voltage, in which a ferroelectric layer thinned to a thickness of 200 Å or more is sandwiched between electrodes, wherein the ferroelectric layer contains insulating particles to suppress leakage current caused through grain boundaries of crystals.

As described above, according to the present invention, there can be provided a high dielectric element having a high dielectric constant and a good withstand voltage, which is thinned to a thickness of 200 Å or more and includes a high dielectric layer, wherein the ferroelectric layer contains insulating particles to suppress leakage current caused through grain boundaries of crystals.

A semiconductor device including a ferroelectric element can be formed by incorporating the above ferroelectric element in a field effect transistor structure.

Further, a semiconductor device including a high dielectric element can be formed by incorporating the above high dielectric element in a field effect transistor structure.

As described above, this invention is effective, when applied to a highly integrated ferroelectric element or high dielectric element, and a semiconductor device using the same.

What is claimed is:

1. A dielectric element comprising an upper electrode, a dielectric thin film, and a lower electrode, wherein said dielectric thin film contains insulating particles having a resistance not smaller than $10^6$ Ω, wherein said dielectric thin film comprises at least one of a ferroelectric thin film and a high dielectric thin film and wherein said ferroelectric thin film has a c-axis with an orientation that is tilted 45° to an electrode plane and has a degree of orientation that is at least 90%.

2. A dielectric element according to claim 1, wherein said insulating particles each have a particle size not larger than 50 Å.

3. A dielectric element according to claim 2, wherein said ferroelectric thin film is made of one kind selected from the group consisting of a material expressed by $(Pb_{1-x}A_x)(Zr_{1-y}Ti_y)O_3$ (where A is one kind selected from the group consisting of La, Ba, and Nb), and a material expressed by $(AO)^{2+}(B_{y-1}C_yO_{3y+1})^{2-}$ (where A is at least one kind selected from a group consisting of Tl, Hg, Pb, Bi, and rare earth elements; B is at least one kind selected from the group consisting of Bi, Pb, Ca, Sr, and Ba; C is at least one kind selected from the group consisting of Ti, Nb, Ta, W, Mo, Fe, Co, Cr and Zr; and y=2, 3, 4, and 5).

4. A dielectric element according to claim 2, wherein said insulating particles are those of a chemical compound containing Si.

5. A dielectric element according to claim 4, wherein said ferroelectric thin film has a thickness of 200 Å or more, and said dielectric element exhibits a withstand voltage not lower than 2 V at a leak current density not larger than $10^{-5}$ $A/cm^2$.

6. A dielectric element according to claim 1, wherein said metal is at least one kind selected from the group consisting of Pt, Au, Al, Ni, Cr, Ti, Mo, and W.

7. A dielectric element according to claim 1, wherein said conductive oxide of a single element is an oxide of at least one kind selected from the group consisting of Ti, V, Eu, Cr, Mo, W, Rh, Os, Ir, Pt, Re, Ru and Sn, and has a resistivity not larger than 1 mΩ·cm.

* * * * *